(12) United States Patent
Takahashi (10) Patent No.: US 11,605,568 B2
(45) Date of Patent: Mar. 14, 2023

(54) SEMICONDUCTOR APPARATUS AND MANUFACTURING METHOD OF SEMICONDUCTOR APPARATUS

(71) Applicant: Mitsubishi Electric Corporation, Tokyo (JP)

(72) Inventor: Takuya Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1 day.

(21) Appl. No.: 17/338,059

(22) Filed: Jun. 3, 2021

(65) Prior Publication Data

US 2022/0157672 A1 May 19, 2022

(30) Foreign Application Priority Data

Nov. 16, 2020 (JP) ............................. JP2020-190395

(51) Int. Cl.
| | |
|---|---|
| *H01L 23/049* | (2006.01) |
| *H01L 23/373* | (2006.01) |
| *H01L 23/00* | (2006.01) |
| *H01L 21/48* | (2006.01) |
| *H01L 23/367* | (2006.01) |
| *H01L 25/18* | (2023.01) |

(52) U.S. Cl.
CPC ........ *H01L 23/049* (2013.01); *H01L 21/4817* (2013.01); *H01L 23/3735* (2013.01); *H01L 24/32* (2013.01); *H01L 24/48* (2013.01); *H01L 24/73* (2013.01); *H01L 23/3672* (2013.01); *H01L 25/18* (2013.01); *H01L 2224/32225* (2013.01); *H01L 2224/48225* (2013.01); *H01L 2224/73265* (2013.01); *H01L 2924/1033* (2013.01); *H01L 2924/10254* (2013.01); *H01L 2924/10272* (2013.01); *H01L 2924/15787* (2013.01); *H01L 2924/3511* (2013.01)

(58) Field of Classification Search
CPC ............... H01L 23/049; H01L 21/4817; H01L 23/3735; H01L 24/32; H01L 24/48; H01L 24/73; H01L 2224/32225; H01L 2224/48225; H01L 2224/73265; H01L 2924/10254; H01L 2924/10272; H01L 2924/1033; H01L 2924/15787; H01L 2924/3511; H01L 2224/48227; H01L 23/49811; H01L 25/18; H01L 23/3672
See application file for complete search history.

(56) References Cited

U.S. PATENT DOCUMENTS 9,859,195 B1 * 1/2018 Shimizu ............ H01L 23/49562
2007/0235860 A1 10/2007 Steger et al.
(Continued)

FOREIGN PATENT DOCUMENTS

JP 2006-295158 A 10/2006

*Primary Examiner* — Patricia D Valenzuela
(74) *Attorney, Agent, or Firm* — Studebaker & Brackett PC (57) ABSTRACT

A semiconductor apparatus includes: an insulating substrate including a circuit pattern; a semiconductor device mounted on the insulating substrate and electrically connected to the circuit pattern; a case storing the insulating substrate and the semiconductor device; and an electrode attached to the case, wherein a tip surface of the electrode is jointed to the circuit pattern with solder, the electrode is brought into contact with and pushed against the circuit pattern by the case, and a projection is provided on the tip surface.

17 Claims, 8 Drawing Sheets

(56) References Cited

U.S. PATENT DOCUMENTS

2016/0343642 A1* 11/2016 Komatsu ................. H01L 24/83
2017/0338189 A1* 11/2017 Soda .................... H01L 23/3672
2019/0139873 A1*  5/2019 Saito ....................... H01L 21/56

* cited by examiner

SEMICONDUCTOR APPARATUS AND MANUFACTURING METHOD OF SEMICONDUCTOR APPARATUS

BACKGROUND OF THE INVENTION

Field

The present disclosure relates to a semiconductor apparatus and a manufacturing method of the semiconductor apparatus.

Background

A semiconductor apparatus in which electrodes attached to a case are solder-jointed to a circuit pattern of an insulating substrate is disclosed (see, for example, Japanese Patent Laid-Open No. 2006-295158).

SUMMARY

Warpage of a semiconductor apparatus occurs due to a difference in linear coefficients of expansion of components during a temperature cycle. This warpage changes positions of electrodes in a vertical direction with respect to a case and an insulating substrate, and thus, tensile stress or compression stress acts in a vertical direction at solder joint portions of the electrodes. The electrodes are less likely to be displaced in a compression direction because of presence of the insulating substrate. However, the electrodes are likely to be displaced in a tensile direction, which degrades the solder and causes peeling and results in a problem that reliability degrades.

The present disclosure has been made to solve the problem as described above and is directed to providing a semiconductor apparatus and a manufacturing method of the semiconductor apparatus which can improve reliability.

A semiconductor apparatus according to the present disclosure includes: an insulating substrate including a circuit pattern; a semiconductor device mounted on the insulating substrate and electrically connected to the circuit pattern; a case storing the insulating substrate and the semiconductor device; and an electrode attached to the case, wherein a tip surface of the electrode is jointed to the circuit pattern with solder, the electrode is brought into contact with and pushed against the circuit pattern by the case, and a projection is provided on the tip surface.

In the present disclosure, the electrode is brought into contact with and pushed against the circuit pattern by the case. This can reduce tensile stress occurring at the jointing portion of the electrode and the circuit pattern by warpage during the temperature cycle. Further, while a thickness of the solder decreases by the electrode being brought into contact with and pushed against the circuit pattern, the thickness of the solder can be maintained by the projection being provided on the tip surface. It is therefore possible to prevent peeling of solder during the temperature cycle and improve reliability.

Other and further objects, features and advantages of the invention will appear more fully from the following description.

DESCRIPTION OF EMBODIMENTS

A semiconductor apparatus and a manufacturing method of the semiconductor apparatus according to the embodiments of the present disclosure will be described with reference to the drawings. The same components will be denoted by the same symbols, and the repeated description thereof may be omitted.

First Embodiment

Figure 1:
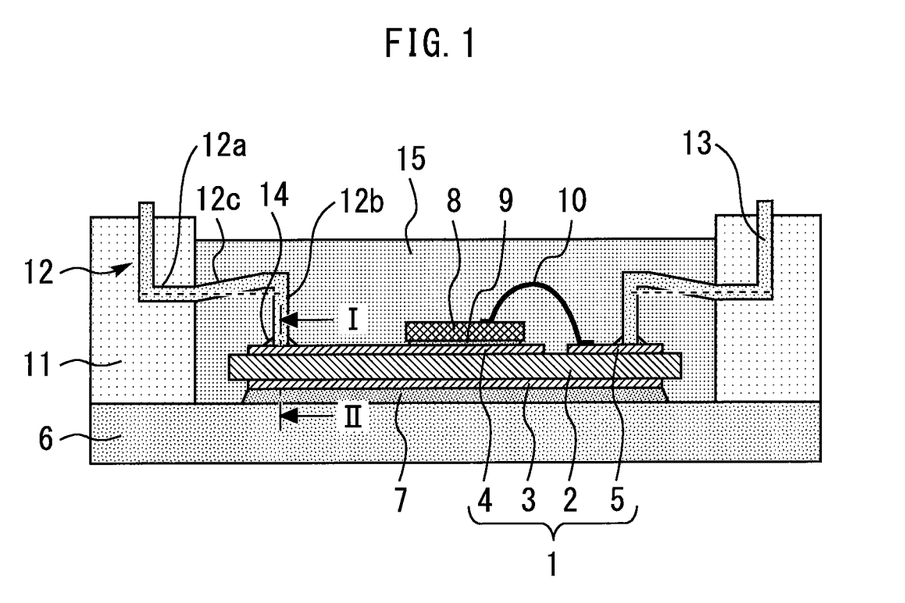
FIG. 1 is a cross-sectional view illustrating a semiconductor apparatus according to a first embodiment.

FIG. 1 is a cross-sectional view illustrating a semiconductor apparatus according to a first embodiment. An insulating substrate 1 includes an insulating plate 2, a metal pattern 3 on a lower surface of the insulating plate 2, and circuit patterns 4 and 5 on an upper surface of the insulating plate 2. The insulating plate 2 is ceramic such as MN and SiN and may be resin insulation.

The metal pattern 3 of the insulating substrate 1 is jointed to an upper surface of a base plate 6 with solder 6. A semiconductor device 8 is mounted on the insulating substrate 1. A lower electrode of the semiconductor device 8 is electrically connected to the circuit pattern 4 with solder 9. Note that jointing is not limited to solder jointing and may be Ag bonding or laser welding. An upper electrode of the semiconductor device 8 is electrically connected to the circuit pattern 5 by wiring 10 such as a wire. A case 11 stores the insulating substrate 1 and the semiconductor device 8. The case 11 is bonded on the upper surface of the base plate 6.

The electrodes 12 and 13 are attached to the case 11. A tip surface of the electrode 12 is jointed to the circuit pattern 4 with solder 14. The electrodes 12 and 13 have a plate-like shape and include principal surfaces which face each other, side surfaces which face each other, and tip surfaces. The tip surface has a rectangular shape, and a short side of the tip surface corresponds to a plate thickness of the electrode 12, and a long side of the tip surface corresponds to a width of the electrode 12.

A seal material 15 seals the insulating substrate 1, the semiconductor device 8 and the electrode 12 to electrically insulate the semiconductor device 8, or the like, from outside. The seal material 15 is, for example, gel and is preferably a resin such as a direct potting resin. The resin inhibits displacement of the electrode 12 during a temperature cycle, so that reliability of solder jointing is improved.

The electrode 12 includes a fixed portion 12a which is inserted into the case 11 and fixed, a rising portion 12b which rises on the circuit pattern 4, and a connection portion 12c which connects the fixed portion 12a and an upper end of the rising portion 12b. A height of the upper end of the rising portion 12b of the electrode 12 is higher than a height of the fixed portion 12a. The fixed portion 12a is parallel to the upper surface of the base plate 6 and the circuit patterns 4 and 5 of the insulating substrate 1. Meanwhile, the connection portion 12c extracted to internal space of the case 11 rises toward the upper end of the rising portion 12b from the fixed portion 12a and tilts with respect to the upper surface of the base plate 6 and the circuit patterns 4 and 5 of the insulating substrate 1. With such a configuration, the electrode 12 is brought into contact with and pushed against the circuit pattern 4 by the case 11. In a similar manner to the electrode 12, a tip surface of the electrode 13 is solder-jointed to the circuit pattern 5, and the electrode 13 is brought into contact with and pushed against the circuit pattern 5 by the case 11.

Figure 2:
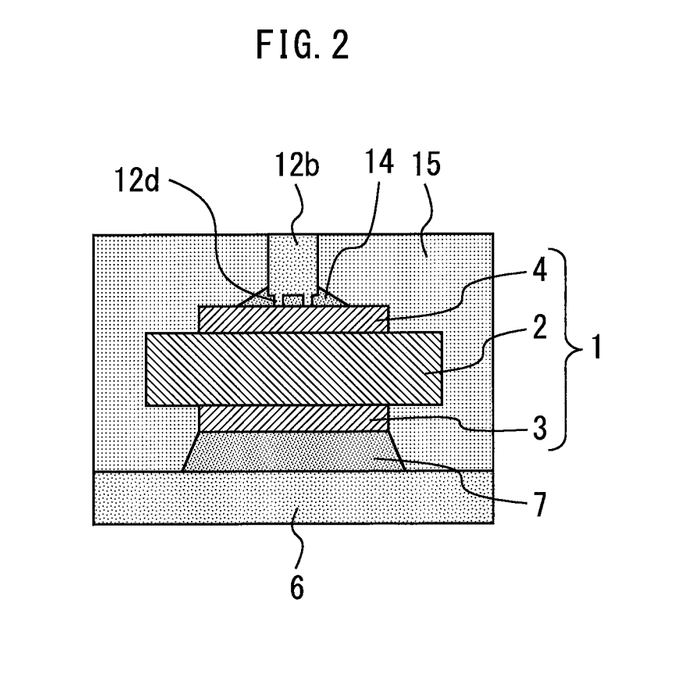
FIG. 2 is an enlarged cross-sectional view along I-II in FIG. 1.

FIG. 2 is an enlarged cross-sectional view along I-II in FIG. 1. A projection 12d is provided on the tip surface. A slight indentation is formed on a surface of the circuit pattern 4 as a result of the projection 12d of the electrode 12 being brought into contact with and pushed against the circuit pattern 4. In a similar manner to the electrode 12, a projection (not illustrated) is also provided on the tip surface of the electrode 13.

Figure 3:
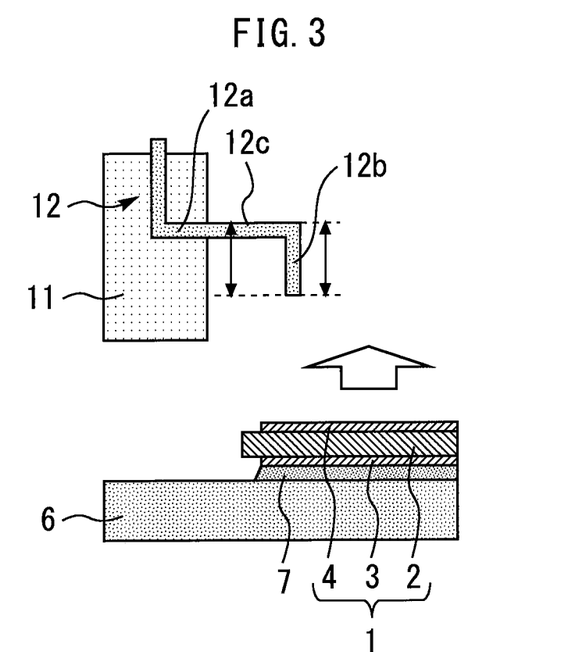
FIG. 3 is a view illustrating manufacturing process of the semiconductor apparatus according to the first embodiment.
Figure 4:
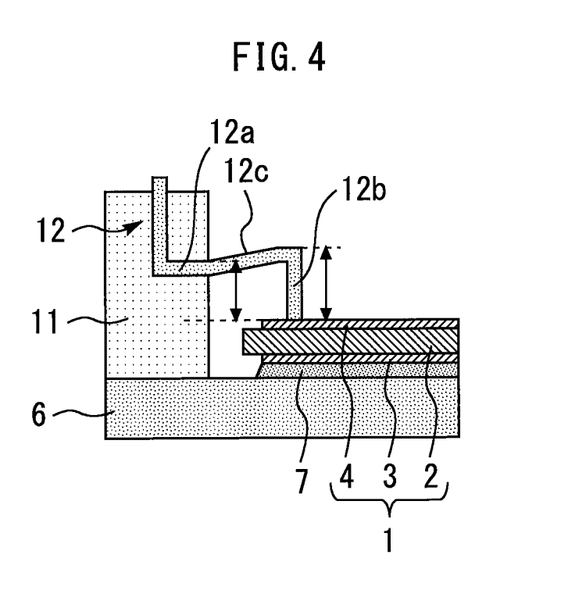
FIG. 4 is a view illustrating manufacturing process of the semiconductor apparatus according to the first embodiment.

Subsequently, a manufacturing method of the semiconductor apparatus according to the present embodiment will be described. FIG. 3 and FIG. 4 are views illustrating manufacturing process of the semiconductor apparatus according to the first embodiment. First, the semiconductor device 8 is mounted on the insulating substrate 1 and is electrically connected to the circuit pattern 4 of the insulating substrate 1. Then, the case 11 is attached on the upper surface of the base plate 6 so as to store the insulating substrate 1 and the semiconductor device 8. In this event, the electrode 12 is brought into contact with and pushed against the circuit pattern 4 by the case 11. Then, the tip surface of the electrode 12 is solder-jointed to the circuit pattern 4.

Before the case 11 is attached, as illustrated in FIG. 3, the fixed portion 12a and the connection portion 12c of the electrode 12 have a linear shape, and the height of the upper end of the rising portion 12b of the electrode 12 is the same as the height of the fixed portion 12a. After the case 11 is attached, as illustrated in FIG. 4, the height of the upper end of the rising portion 12b of the electrode 12 becomes higher than the height of the fixed portion 12a. Such deformation of the electrode 12 brings the electrode 12 into contact with and pushed against the circuit pattern 4.

In the present embodiment, the electrode 12 is brought into contact with and pushed against the circuit pattern 4 by the case 11. This can reduce tensile stress occurring at the jointing portion of the electrode 12 and the circuit pattern 4 by warpage during the temperature cycle. Further, while a thickness of the solder 14 decreases by the electrode being brought into contact with and pushed against the circuit pattern, the thickness of the solder 14 can be maintained by the projection 12d being provided on the tip surface. It is therefore possible to prevent peeling of solder during the temperature cycle and improve reliability.

Further, stress can be alleviated in a case where the solder 14 is provided at a peripheral portion of the tip surface where the stress is greater. Thus, the projection 12d is preferably not provided at the peripheral portion of the tip surface. Further, two or more projections 12d are preferably provided so as to be able to maintain a uniform thickness of the solder 14. This improves reliability of solder jointing.

Further, not a plane of the plate-like electrode 12, but the tip surface of the rising portion 12b of the electrode 12 is jointed to the circuit pattern 4. This reduces a jointing area of the electrode 12. Thus, space for jointing the semiconductor device 8 or the wiring 10 to the circuit pattern 4 to which the electrode 12 is jointed, increases. Further, it is possible to increase current capacity.

Figure 5:
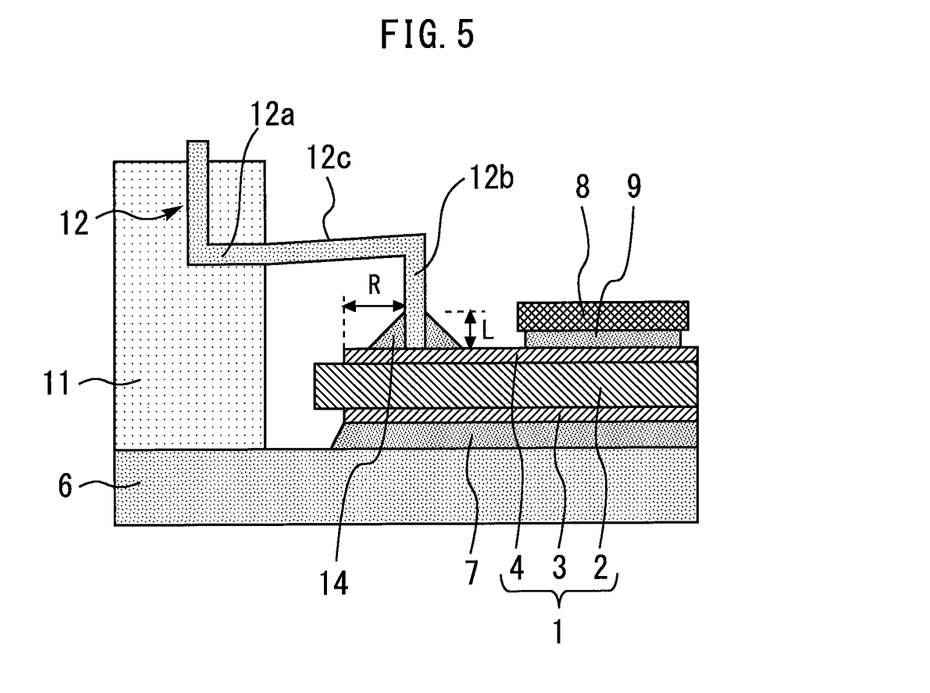
FIG. 5 is an enlarged cross-sectional view of part of the semiconductor apparatus according to the first embodiment.

FIG. 5 is an enlarged cross-sectional view of part of the semiconductor apparatus according to the first embodiment. A distance R from the jointing portion of the electrode 12 and the circuit pattern 4 to an end portion of the circuit pattern 4, the semiconductor device 8 or external wiring 10 is equal to or longer than a height L of the solder 14 (R≥L). As a result, a fillet of the solder 14 has a shape having a gentle slope of an angle less than 45°, which reduces stress to the solder 14, so that reliability of solder jointing is improved.

Second Embodiment

Figure 6:
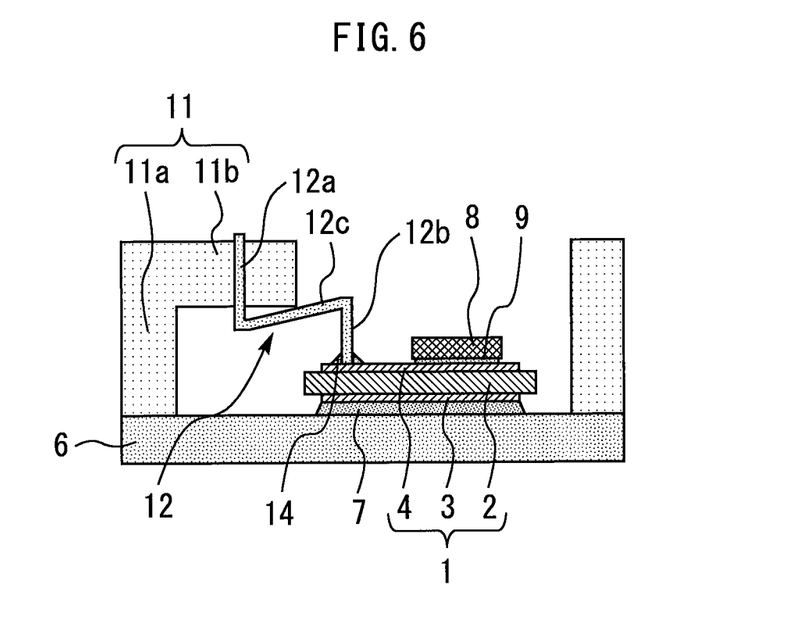
FIG. 6 is a cross-sectional view illustrating a semiconductor apparatus according to a second embodiment.

FIG. 6 is a cross-sectional view illustrating a semiconductor apparatus according to a second embodiment. The case 11 includes an external wall 11a which is a rectangular frame enclosing the insulating substrate 1 and the semiconductor device 8, and a projecting portion 11b which projects toward inside of the external wall 11a from the external wall 11a. The connection portion 12c of the electrode 12 extracted to inside of the external wall 11a is displaced in an upper direction, but pushed down by making contact with a lower surface of the projecting portion 11b. As a result, the electrode 12 receives force of being brought into contact with and pushed against the circuit pattern 4. By this means, in a similar manner to the first embodiment, it is possible to reduce tensile stress occurring at the jointing portion of the electrode 12 and the circuit pattern 4 by warpage during the temperature cycle.

Figure 7:
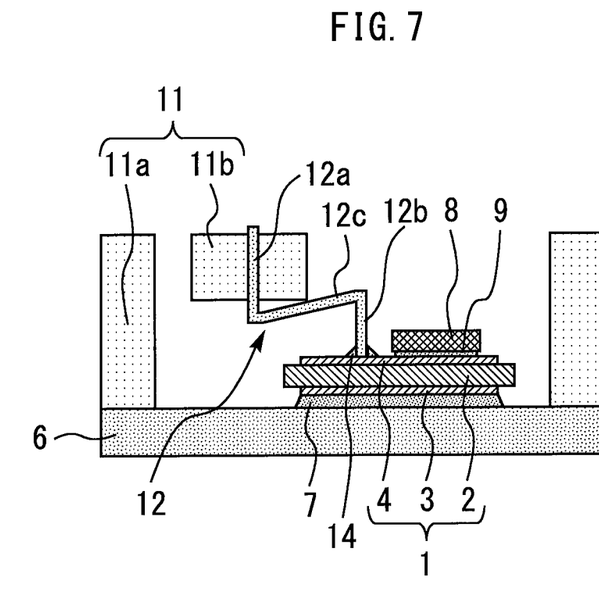
FIG. 7 is a cross-sectional view of a modified example of the semiconductor apparatus according to the second embodiment.
Figure 8:
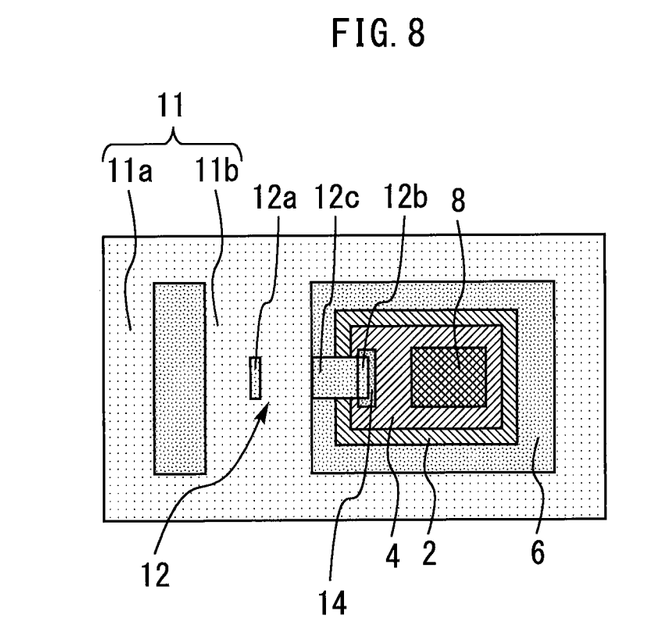
FIG. 8 is a top view illustrating the modified example of the semiconductor apparatus according to the second embodiment.

FIG. 7 is a cross-sectional view of a modified example of the semiconductor apparatus according to the second embodiment. FIG. 8 is a top view illustrating the modified example of the semiconductor apparatus according to the second embodiment. The projecting portion 11b becomes a beam which runs across the external wall 11a of the case 11, which faces each other. Also in this case, the above-described effects are provided.

Third Embodiment

Figure 9:
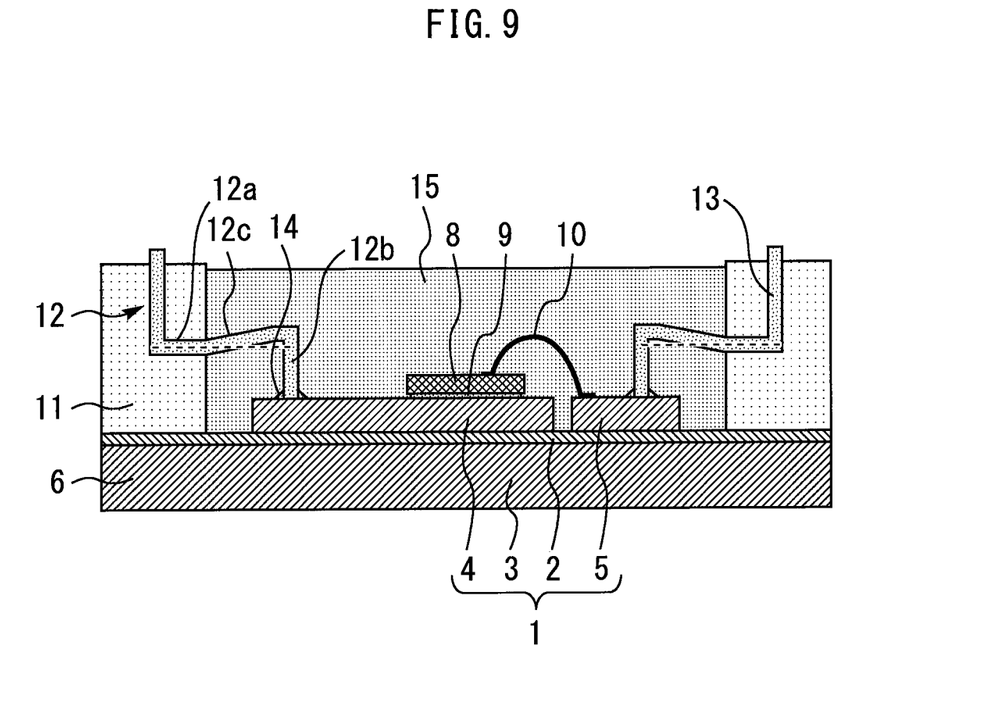
FIG. 9 is a cross-sectional view illustrating a semiconductor apparatus according to a third embodiment.

FIG. 9 is a cross-sectional view illustrating a semiconductor apparatus according to a third embodiment. The case 11 is directly bonded to the insulating substrate 1 and fixed. Other configurations are similar to those of the first embodiment. Also in this case, the electrodes 12 and 13 are brought into contact with and pushed against the circuit patterns 4 and 5 by the case 11, so that it is possible to obtain effects similar to those of the first embodiment.

Fourth Embodiment

Figure 10:
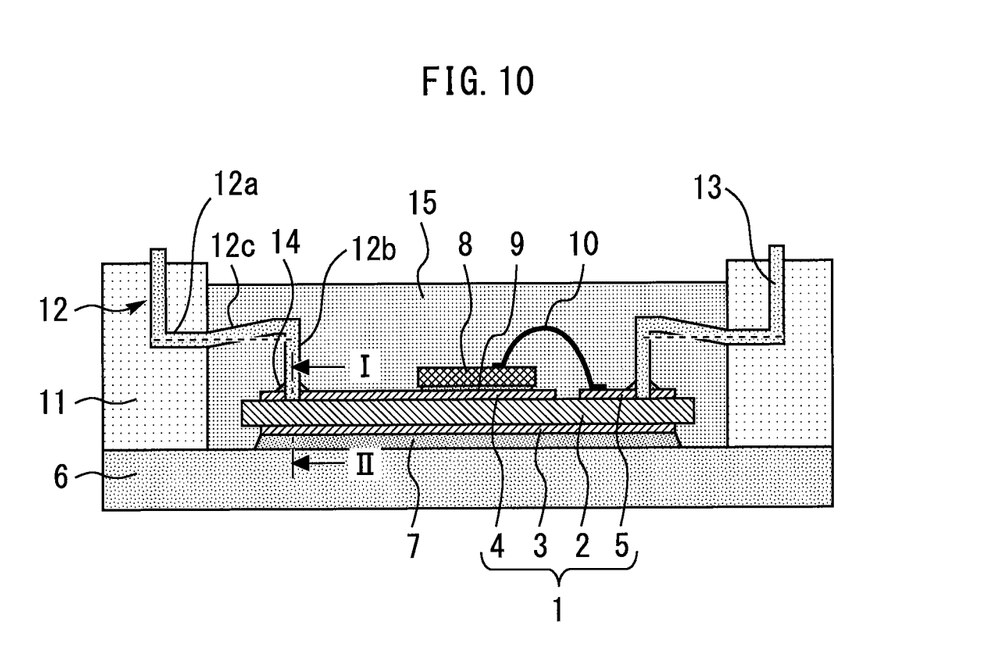
FIG. 10 is a cross-sectional view illustrating a semiconductor apparatus according to a fourth embodiment.
Figure 11:
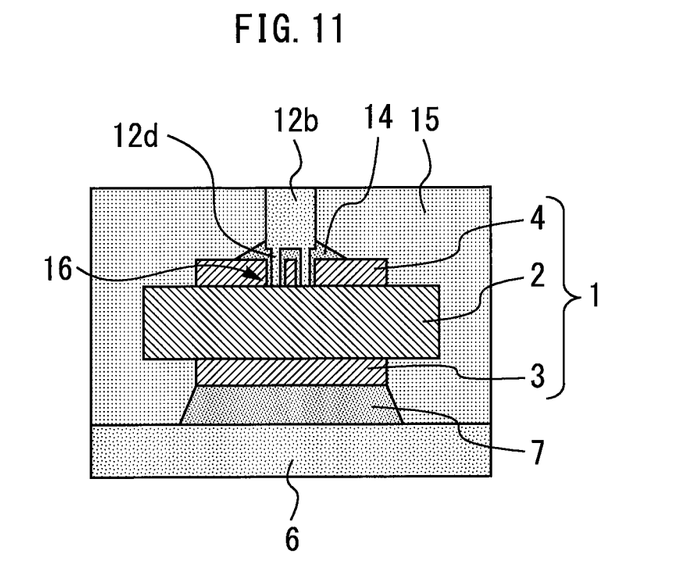
FIG. 11 is an enlarged cross-sectional view along I-II in FIG. 10.

FIG. 10 is a cross-sectional view illustrating a semiconductor apparatus according to a fourth embodiment. FIG. 11 is an enlarged cross-sectional view along I-II in FIG. 10. A recess 16 is provided on the circuit pattern 4. The recess 16 does not have to pass through the circuit pattern 4 and reach the insulating plate 2. The projection 12d is fitted into the recess 16. This increases a jointing region of the circuit pattern 4 and the solder 14, so that reliability of jointing is improved.

Fifth Embodiment

Figure 12:
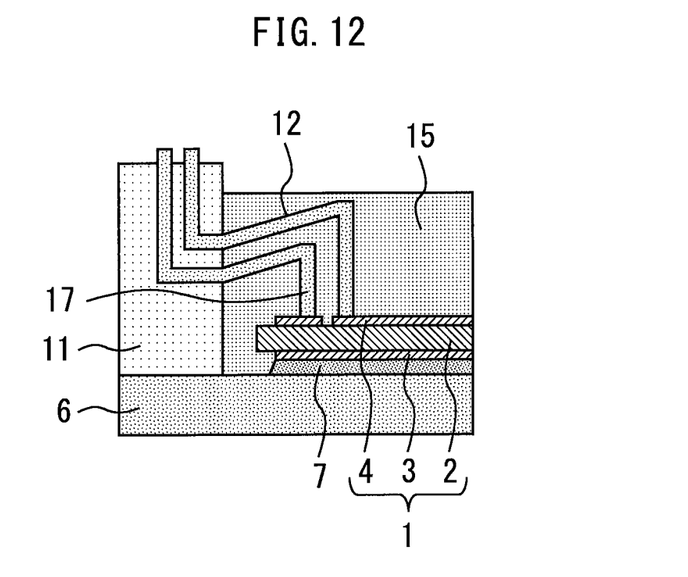
FIG. 12 is a cross-sectional view illustrating a semiconductor apparatus according to a fifth embodiment.

FIG. 12 is a cross-sectional view illustrating a semiconductor apparatus according to a fifth embodiment. Another electrode 17 is placed in parallel to the electrode 12. Placing two electrodes 12 and 17 whose current directions are opposite to each other in parallel in proximity to each other cancels out magnetic fields each other, so that it is possible to reduce inductance. Further, in a case where the two electrodes 12 and 17 have the same potential, electrode density can be increased, so that energization capability is improved.

Sixth Embodiment

Figure 13:
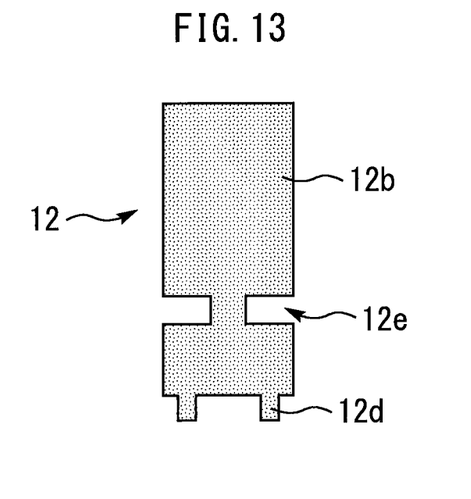
FIG. 13 is a side view illustrating a rising portion of an electrode according to a sixth embodiment.

FIG. 13 is a side view illustrating a rising portion of an electrode according to a sixth embodiment. Slits 12e are provided on a side surface of the rising portion 12b of the electrode 12. Stiffness of the electrode 12 is lowered at the slits 12e. As a result, stress to the solder 14 by deformation of the electrode 12 is reduced, so that reliability of solder jointing is improved.

Figure 14:
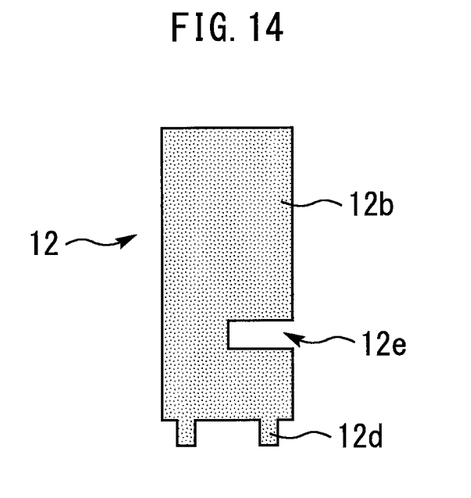
FIG. 14 is a side view illustrating modified example 1 of the rising portion of the electrode according to the sixth embodiment.

FIG. 14 is a side view illustrating modified example 1 of the rising portion of the electrode according to the sixth embodiment. While the slits 12e are provided on both sides of the rising portion 12b in FIG. 13, the slit 12e is provided only on one side in FIG. 14. Also in this case, similar effects can be obtained.

Figure 15:
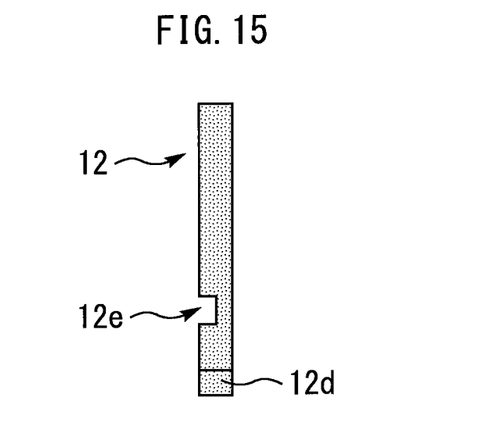
FIG. 15 is a side view illustrating modified example 2 of the rising portion of the electrode according to the sixth embodiment.

FIG. 15 is a side view illustrating modified example 2 of the rising portion of the electrode according to the sixth embodiment. The slit 12e is provided in a thickness direction, so that a thickness of the rising portion 12b of the electrode 12 becomes partially thin. Stiffness of the electrode 12 is lowered at this thin portion. As a result, stress to the solder 14 by deformation of the electrode 12 is reduced, so that reliability of solder jointing is improved.

The semiconductor device 8 is not limited to a semiconductor device formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor apparatus in which the semiconductor device is incorporated. Further, since the semiconductor device has a high heat resistance, a radiation fin of a heatsink can be miniaturized and a water-cooled part can be air-cooled, which leads to further miniaturization of the semiconductor apparatus. Further, since the semiconductor device has a low power loss and a high efficiency, a highly efficient semiconductor apparatus can be achieved.

Further, the semiconductor device 8 formed of a wide-bandgap semiconductor can operate at a high temperature. On the other hand, by applying the above embodiments, the stress of the solder 14 can be reduced, so that the reliability at a high temperature is improved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-190395, filed on Nov. 16, 2020 including specification, claims, drawings and summary, on which the convention priority of the present application is based, is incorporated herein by reference in its entirety.

The invention claimed is:

1. A semiconductor apparatus comprising:
an insulating substrate including a circuit pattern;
a semiconductor device mounted on the insulating substrate and electrically connected to the circuit pattern;
a case storing the insulating substrate and the semiconductor device; and
an electrode attached to the case,
wherein a tip surface of the electrode is jointed to the circuit pattern with solder,
the electrode is brought into contact with and pushed against the circuit pattern by the case, and
a projection is provided on the tip surface.

2. The semiconductor apparatus according to claim 1, wherein the electrode includes a fixed portion fixed to the case, and a rising portion rising on the circuit pattern, and
a height of an upper end of the rising portion of the electrode is higher than a height of the fixed portion.

3. The semiconductor apparatus according to claim 1, wherein the case includes an external wall enclosing the insulating substrate and the semiconductor device, and a projecting portion projecting toward inside of the external wall from the external wall, and
the electrode is pushed down by making contact with a lower surface of the projecting portion and receives force of being brought into contact with and pushed against the circuit pattern.

4. The semiconductor apparatus according to claim 1, further comprising a base plate,
wherein the insulating substrate is jointed to an upper surface of the base plate, and
the case is bonded on the upper surface of the base plate.

5. The semiconductor apparatus according to claim 1, wherein the case is directly bonded to the insulating substrate.

6. The semiconductor apparatus according to claim 1, wherein a recess is provided on the circuit pattern, and
the projection is fitted into the recess.

7. The semiconductor apparatus according to claim 1, further comprising another electrode placed in parallel to the electrode.

8. The semiconductor apparatus according to claim 1, wherein the projection is not provided at a peripheral portion of the tip surface.

9. The semiconductor apparatus according to claim 1, wherein two or more projections are provided.

10. The semiconductor apparatus according to claim 1, wherein a slit is provided on a side surface of the rising portion of the electrode.

11. The semiconductor apparatus according to claim 1, wherein a thickness of the rising portion of the electrode is partially thin.

12. The semiconductor apparatus according to claim 1, wherein the semiconductor device or a wiring is joined to the circuit pattern to which the electrode is jointed.

13. The semiconductor apparatus according to claim 12, wherein a distance from a jointing portion of the electrode and the circuit pattern to an end portion of the circuit pattern, the semiconductor device or external wiring is equal to or longer than a height of the solder.

14. The semiconductor apparatus according to claim 1, further comprising a resin sealing the insulating substrate, the semiconductor device and the electrode, the resin contained within the case.

15. The semiconductor apparatus according to claim 1, wherein the semiconductor device is formed of a wide-bandgap semiconductor.

16. A manufacturing method of the semiconductor apparatus comprising:
  mounting a semiconductor device on an insulating substrate and electrically connecting the semiconductor device to a circuit pattern of the insulating substrate; and
  attaching a case so as to store the insulating substrate and the semiconductor device and solder-jointing a tip surface of an electrode attached to the case, to the circuit pattern,
  wherein when the case is attached, the electrode is brought into contact with and pushed against the circuit pattern by the case, and
  a projection is provided on the tip surface.

17. The semiconductor apparatus according to claim 1, wherein the projection is in direct contact with the circuit pattern.

* * * * *